United States Patent [19]
Clark

[11] Patent Number: 5,159,615
[45] Date of Patent: Oct. 27, 1992

[54] DIGITAL FREQUENCY DETECTION CIRCUIT

[75] Inventor: Lawrence T. Clark, Tempe, Ariz.

[73] Assignee: VLSI Technology, Inc., San Jose, Calif.

[21] Appl. No.: 811,778

[22] Filed: Dec. 20, 1991

[51] Int. Cl.$^5$ .............................................. H03K 5/04
[52] U.S. Cl. ...................................... 377/56; 377/106; 377/20; 328/138; 307/522
[58] Field of Search ...................... 377/56, 106, 19, 20; 307/522, 523; 328/138, 140

[56] References Cited

U.S. PATENT DOCUMENTS

| | | | |
|---|---|---|---|
| 4,326,256 | 4/1982 | Furumoto | 328/138 |
| 4,330,751 | 5/1982 | Swain | 377/56 |
| 4,360,782 | 11/1982 | Nowell | 328/138 |
| 4,390,843 | 6/1983 | Betts et al. | 328/138 |

OTHER PUBLICATIONS

Intel AR116, pp. 7-112 to 7-115 and 7-122, 7-123.
IEEE Journal of Solid-State Circuits, vol. 26, 1991, pp. 119-120.

Primary Examiner—Janice A. Howell
Assistant Examiner—Scott A. Ouellette
Attorney, Agent, or Firm—LaValle D. Ptak

[57] ABSTRACT

A digital frequency detection circuit, or frequency discriminator, is implemented for use as a synchronization field detector for the synchronization field frequency in the data stream read from a computer floppy disk. No analog components are utilized; and the detector produces an output indicative of the presence of a valid synchronization field frequency whenever the incoming data pulses fall within a predetermined range of frequencies having a lowest frequency limit and an upper frequency limit. This is accomplished by employing a multi-stage binary counter for counting the reference clock pulses from a computer. The counter is reset each time an incoming data pulse is received; and the outputs of the counter are coupled to coincidence gates, which establish the lowest and highest frequency limits of the predetermined range of frequencies to be detected. The outputs of the coincidence gates then are applied to inputs of a digital latch circuit, which also is responsive to the incoming data pulses for producing an output indicative of the presence or absence of input data signals within the desired range of frequencies.

4 Claims, 2 Drawing Sheets

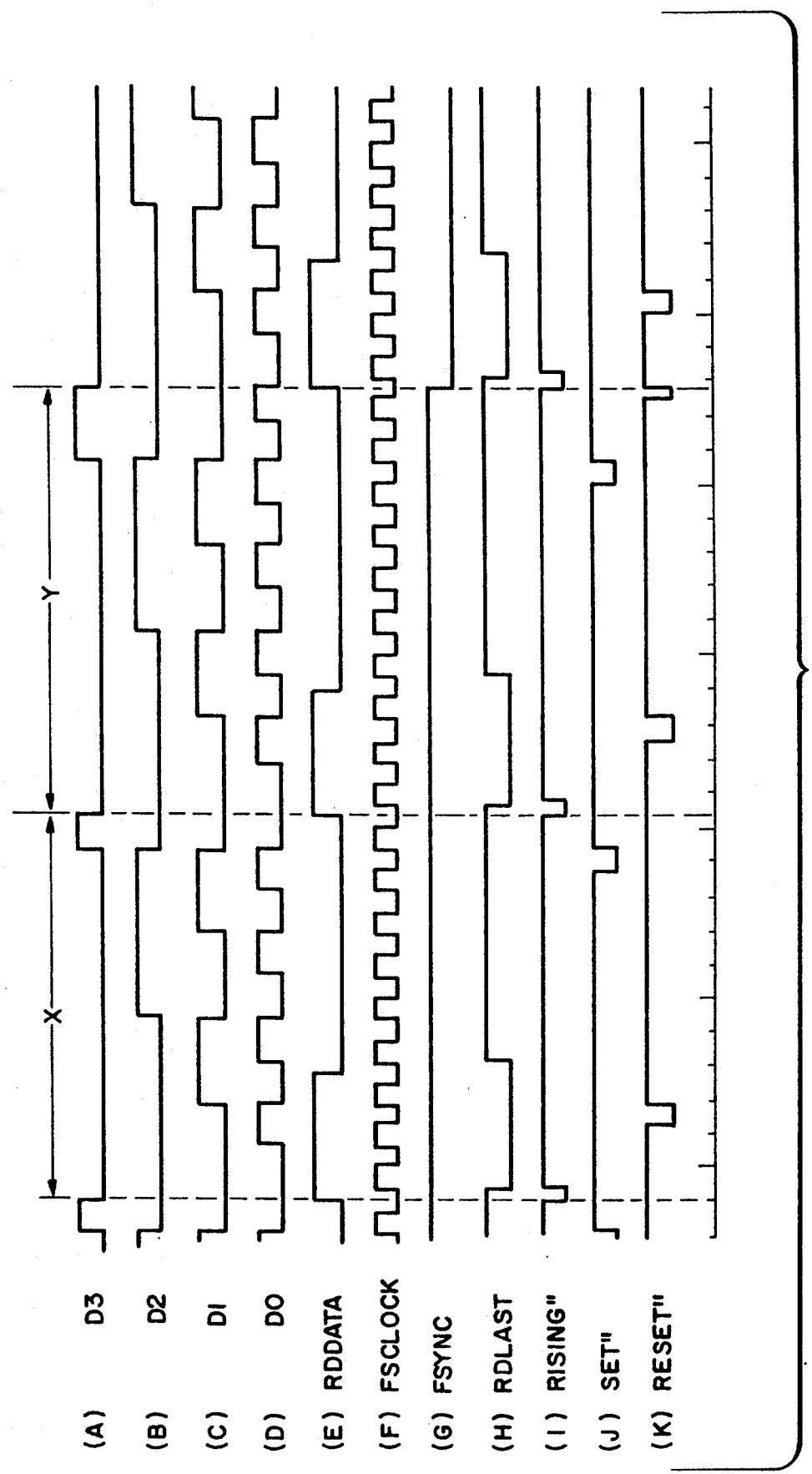

DIGITAL FREQUENCY DETECTION CIRCUIT

BACKGROUND

Personal computers (PC's) utilize floppy disks for transferring data to and from the computer. Floppy disks encoded in modified FM (MFM) are in widespread use. It is necessary to synchronize the transfer of information from the disk in the disk drive of the computer with the internal clock of the computer. To accomplish this, the voltage controlled oscillator of the computer, which is used to provide the clock signals, is synchronized in frequency with the synchronization field frequency encoded on the disk. It is possible for variations as much as plus and minus 10% to occur between the internal clock frequency of the computer and the synchronization field frequency read from the disk. This may be caused by differences between the speed of operation of the disk drive motor in the computer where the information originally was stored and the motor in the drive of the computer with which the disk is to be used.

In the past, this synchronization typically has been handled by voltage controlled oscillators in conjunction with an analog phase-locked loop (PLL). Such analog phase-locked loops employ a re-triggerable monostable multivibrator or "one-shot", which is continuously triggered into its astable mode by each incoming synchronization field bit. If these bits do not occur successively prior to the time-out period of the monostable multivibrator, it resets to its stable state, indicative of a failure to detect a synchronization field frequency. The detection of the synchronization field frequency is necessary to enable the PLL loop to respond properly to incoming data for synchronization purposes.

It has been believed that only an analog system could provide the necessary reliability. Three significant disadvantages, however, are inherent with analog monostable multivibrator circuits for providing the detection of synchronization field frequency encoded on the disk. The first of these disadvantages is that such circuits are difficult to fabricate with precision and predictability in an integrated circuit. Generally, analog monostable multivibrators require external trimming components, in addition to those components which can be fabricated directly on the integrated circuit.

A second disadvantage is that analog components are subject to significant drift with temperature. Thus, any analog design must allow sufficient margin for such drift.

The third, and perhaps most significant, disadvantage is that the resulting frequency detector necessarily detects all frequencies which are greater than or equal to the desired one (namely, the synchronization field frequency). Since this has been necessary with past analog circuits using a monostable multivibrator as the detector, the frequency sought (and which is used on the floppy disk as the synchronization field) must be the highest frequency encountered. If the frequency, however, is too high, the monostable multivibrator cannot distinguish this condition, since any frequency equal to or greater than the frequency of interest will cause the output to be indicative of detection of the desired frequency.

A digital synchronous field detector circuit has been implemented to replace the conventional analog circuit composed of a monostable multivibrator. This digital synchronous field detector employs eight phase window pulses generated by the reference clock and classified into four pairs; so that the difference in phase of each pair is four times the period of the reference clock. A pattern of synchronous fields then is detected whenever two neighboring "ones" in the input data exist in paired window. The window pulses generated from the reference clock are asynchronous with the read data; and they have different frequencies and phases. The read data read from a disk includes significant jitter. Consequently, in order to secure operation, whatever the phase relation, an arrangement is made in this system so that the windows are continuous, and neighboring windows overlap. The result is a very complex circuit, requiring a large number of components. The system, however, does overcome the adjustment and temperature drift problems inherent in conventional analog circuits.

It is desirable to provide a digital frequency detection circuit which is suitable for detecting the digital synchronous field of an MFM encoded floppy disk which is simple, uses a minimum number of components, and is capable of detecting frequencies within a range of frequencies determined by a lower frequency limit and an upper frequency limit, such that the frequency detection circuit overcomes the disadvantages of the prior art noted above.

SUMMARY OF THE INVENTION

Accordingly, it is an object of this invention to provide an improved frequency detection circuit.

It is another object of this invention to provide an improved digital frequency detection or discrimination circuit.

It is an additional object of this invention to provide a digital frequency detection circuit, which may be implemented in an integrated circuit.

It is a further object of this invention to provide an improved digital frequency detection, which is capable of detecting frequencies located within a pre-established range of frequencies.

In accordance with a preferred embodiment of the invention, a digital frequency detection circuit comprises a multi-stage binary counter, which is advanced by a source of reference clock pulses. A source of incoming binary data pulses, the frequency of which is to be detected, is supplied to a reset circuit for resetting the counter to an initial count in response to each incoming data pulse. A latch circuit, including coincidence gates, is coupled with selected outputs of the counter, the reset circuit, and the source of clock pulses to produce a predetermined output whenever the frequency of the incoming data pulses is within a predetermined range of frequencies, or frequency window.

BRIEF DESCRIPTION OF THE DRAWINGS

FIG. 2 is a waveform diagram, usable in explaining the operation of the circuit of FIG. 1.

DETAILED DESCRIPTION

Figure 1:
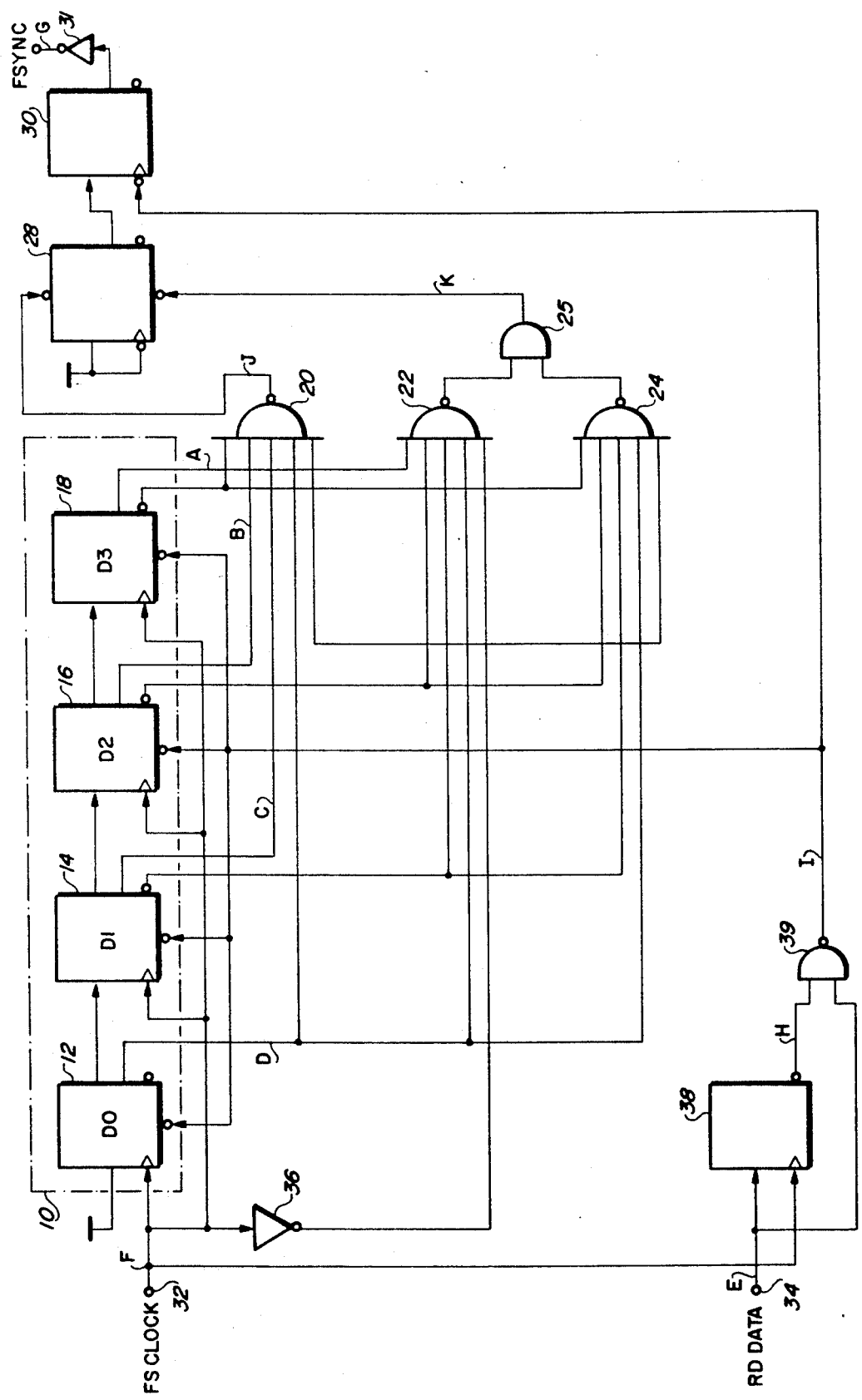
FIG. 1 is a block schematic diagram of a preferred embodiment of the invention.

FIG. 1 is a block diagram of a preferred embodiment of a digital frequency detection circuit for detecting the frequency of incoming signals, which appear between upper and lower frequency limits At the heart of the detector circuit is a multi-stage binary counter 10. As illustrated in FIG. 1, the counter 10 has four cascaded stages, 12, 14, 16, and 18 in it. The binary counter may be implemented in any standard configuration for such counters. It also should be noted that the number of stages shown is for purposes of illustration, and should not be considered as limiting. Depending upon the particular application with which the frequency detection circuit is to be used, counters having a greater number or a lesser number of stages also may be employed. The principles of the invention, as described in conjunction with FIG. 1, however, are the same, irrespective of the number of stages used in the counter.

Clock pulses from the computer for advancing the counter are supplied to an input terminal 32, and comprise waveform F of FIG. 2. These clock pulses are applied in parallel to the clock trigger input of each of the four stages 12, 14, 16 and 18 of the counter 10, which responds to successive clock pulses to advance a standard binary count through the different stages of the counter.

Reference to FIG. 2 shows the normal outputs of each of the stages of the counter 12, 14, 16 and 18 indicated as waveforms D, C, B and A, respectively, in FIG. 2. These outputs are indicated in FIG. 2 for the operation of the counter following each of successive reset pulses supplied to the counter 10.

Three coincidence gates 20, 22 and 24, in the form of NAND gates, are connected to respond to different ones of the noninverted and inverted outputs of the various stages 12, 14, 16 and 18 of the counter, and to inverted clock pulses obtained from the output of an invertor 36. The inverted clock pulses are applied to all three NAND gates 20, 22 and 24 to synchronize the outputs of these gates with the advancement of the counter 10. As is readily apparent from an examination of FIG. 1, the NAND gate 20 responds to the normal outputs of the stages 12, 14 and 16 of the counter, and the inverted output of the stage 18. Similarly, the NAND gate 22 responds to the normal outputs of the stages 12 and 18, and to the inverted outputs of the stages 14 and 16 of the counter. Finally, the NAND gate 24 responds to the normal output of the stage 12, and inverted outputs of stages 14, 16 and 18.

These interconnections to the NAND gates 20, 22 and 24 establish the frequency range or window of the frequencies which the digital frequency detection circuit is intended to detect. The NAND gate 20 controls the highest frequency (shortest period) of the window. The output of the NAND gate 20 (waveform J of FIG. 2) is applied to the "set" input of a permanently enabled latch circuit 28, set to operate as a set/reset latch. The output of the circuit 28 is applied to the enable input of an output latch 30, which supplies the synchronization detection output of the circuit through an inverter 31. This circuit output is shown as waveform G in FIG. 2.

Similarly, the outputs of the two NAND gates 22 and 24 are supplied to the two different inputs of a two-input AND gate 25 to produce the reset trigger input to the flip-flop 28. This reset input is shown in waveform K of FIG. 2. The NAND gate 22 responds to a count in the counter 10, which corresponds with the lowest frequency of the frequency range or window to be detected (that is, the longest period), and supplies a reset signal through the AND gate 25 to the reset terminal of the flip-flop 28. Similarly, the NAND gate 24 provides a reset signal through the AND gate 25 each time the counter 10 is reset back to its zero or initial count.

Read data pulses, the frequency of which are to be detected, are applied on a terminal 34, and are shown in waveform E of FIG. 2. These pulses are applied to the enable input of a flip-flop 38, which is triggered by the clock pulses appearing on the terminal 32. The inverted output of the flip-flop 38 appears on the upper one of two leads to a NAND gate 39, and this output is shown in waveform H of FIG. 2. It is to be noted that waveform H is the inverse (delayed by the timing of the clock pulses) of the read data pulse waveform E, and therefore, comprises a representation of the binary state of the last read read pulse. It is apparent from a comparison of waveforms E (read data) and H (read last) of FIG. 2 of the manner in which these two pulse trains are mirror images of one another, with the delay imposed by the clock pulses appearing on terminal 32 (waveform F of FIG. 2).

The other input to the NAND gate 39 constitutes the present state of the read data pulse appearing on the terminal 34; so that the output of the NAND gate 39 is a sequence of short negative pulses (waveform I of FIG. 2) the width of which is determined by the amount of delay by which the waveform H trails the waveform E. Once again, this is readily apparent from the timing diagram of the various waveforms shown in FIG. 2. The pulses of waveform I are employed to reset all of the stages of the counter 10 to a binary "0" each time the "rising" pulse of waveform I appears. This pulse also is used as a trigger pulse for the output latch flip-flop 30 to produce an output signal indicative of successive read data pulses appearing within the predetermined frequency range of the system as established by the counter 10 and the coincidence gates 20, 22, 24 and 25. The manner in which the system operates to accomplish this is best understood with reference to the timing diagram of FIG. 2.

FIG. 2 shows the various events which take place at the different labeled points A through K of the circuit of FIG. 1 under the operation of the clock signals of waveform F and the read data input signals of waveform E. The outputs of the different stages of the circuit of FIG. 1 are shown in FIG. 2, which correlates those outputs with the same letters placed in the different parts of the circuit of FIG. 1.

The time interval "X" between the first two successive read data pulses of waveform E, shown in FIG. 2, does not result in a synchronization output signal (waveform G), as is readily apparent from an examination of FIG. 2. The reason for this is that when the second read data pulse appears in the time frame shown in FIG. 2, its frequency is too high, and, therefore, it is outside the window of frequencies which the circuit is designed to detect. Thus, no indication of a detected frequency is provided at the output of the flip-flop 30 and invertor 31 of the circuit. This is in direct contrast to the analog circuits of the prior art, which would provide an indication of a detected frequency for this condition.

The next time interval "Y" of FIG. 2 is slightly greater (therefore, the frequency of the read data pulses is lower than the frequency for the interval "X" in FIG. 2) and is sufficient to fall within the window established by the outputs of the NAND gates 20 and 22, such that the set/reset flip-flop 28 receives the reset pulse of waveform K just prior to the time the next read data pulse is applied to cause the trigger pulse I on the output of the NAND gate 39. This results in the inverted output state of the latch flip-flop 30 changing ("high" to "low") as shown in waveform G to produce an output indication that the frequency of the read data pulses on waveform E is within the frequency detection window, that is, the frequency of the read data pulses is between a preestablished lowest frequency and a pre-established highest frequency.

The foregoing description is to be considered as illustrative of the invention, and not as limiting. Various changes and modifications will occur to those skilled in the art, without departing from the true scope of the invention as defined in the appended claims.

I claim:

1. A digital frequency detection circuit including combination:

a multi-stage binary counter;
   a source of reference clock pulses;
   a source of incoming binary data pulses;
   means for coupling said source of clock pulses to said counter to advance a count in said counter in response to said clock pulses;
   reset means responsive to said incoming binary data pulses and coupled with said binary counter to reset said counter to an initial count in response to each incoming data pulse; and
   latch circuit means coupled with selected outputs of said counter, said reset means, and said source of clock pulses for producing a predetermined output whenever a frequency of said incoming binary data pulses is within a predetermined range of frequencies.

2. The combination according to claim 1 wherein said latch circuit means comprises at least first and second coincidence gate means coupled with said counter, said first coincidence gate means producing a predetermined output corresponding to a highest frequency of said predetermined range of frequencies, and said second coincidence gate means producing an output corresponding to a lowest frequency of said predetermined range of frequencies.

3. The combination according to claim 2 wherein said latch circuit means further includes a bistable latch circuit coupled with said first and second coincidence gate means, and responsive to said incoming binary data pulses and said clock pulses for producing an output indicative of the frequency of said incoming binary data pulses occurring within said predetermined range of frequencies.

4. The combination according to claim 3 wherein said counter has a plurality of outputs and said first and second coincidence gate means each have a plurality of inputs connected with corresponding ones of the outputs of said counter representative of said highest and lowest frequencies, respectively.

* * * * *